(12) United States Patent
Shih et al.

(10) Patent No.: US 6,247,159 B1
(45) Date of Patent: *Jun. 12, 2001

(54) METHOD AND APPARATUS FOR ENCODING A BINARY SIGNAL

(75) Inventors: Shih-Ming Shih; Hemant Thapar, both of San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/389,872

(22) Filed: Sep. 2, 1999

Related U.S. Application Data (63) Continuation of application No. 08/940,869, filed on Sep. 30, 1997, now Pat. No. 6,035,435.

(51) Int. Cl.[7] .............................. G06F 11/10; H03M 13/12
(52) U.S. Cl. ............................................................ 714/795
(58) Field of Search ..................................... 714/755, 756, 714/792, 794, 795; 341/58, 59, 95; 360/40, 44; 375/263, 296, 308, 332, 341, 348

(56) References Cited

U.S. PATENT DOCUMENTS

| | | | |
|---|---|---|---|
| 4,707,681 | * 11/1987 | Eggenberger et al. | 341/59 |
| 5,428,631 | * 6/1995 | Zehavi | 714/792 |
| 5,497,384 | * 3/1996 | Fredrickson et al. | 714/792 |
| 5,754,593 | * 5/1998 | Koren | 375/263 |
| 5,757,822 | * 5/1998 | Fisher et al. | 714/795 |

OTHER PUBLICATIONS

Thapar, et al., "A Class of Partial Response Systems for Increasing Storage Density in Magnetic Recording", IEEE Transactions on Magnetics, vol. MAG–23, No. 5, Sep. 1987.

Lee et al., "Digital Communication", Kluwer Academic Publishers, Second Edition.

Marcus et al., "Finite–State Modulation Codes for Data Storage", IEEE Journal of Selected Areas in Communications, vol. 10, No. 1, pp. 5–37, Jan. 1992.

* cited by examiner

*Primary Examiner*—Emmanuel L. Moise (57) ABSTRACT

A system and method described for avoiding catastrophic error sequences in a media code sequence of symbols for data storage on a storage medium according to EPRML. The system and method includes modulation encoding user data which is to be stored on the storage medium using a modulation encoder. The modulation encoder outputs a channel code modulation output symbol sequence. The modulation code is defined according to a modulation criteria wherein the set of all possible modulation output symbol sequences is constrained in a manner which excludes certain excluded modulation output symbol sequences. A precoder precodes the channel code modulation output symbol sequence according to a precoding transfer function. The precoding transfer function transforms the channel code modulation output symbol sequence into a media code sequence of symbols and the precoding transfer function is defined so that when modulation encoding is performed according to the modulation criteria, the media code sequence of symbols is constrained to exclude EPRML catastrophic error sequences of greater than a determined length. The combination of the modulation encoding and the precoding prevents the media code sequence of symbols from including EPRML catastrophic error sequences greater than the determined length.

23 Claims, 5 Drawing Sheets

PR4 PRML CODING

| c(n) | a(n-2) | a(n) | c'(n) |
|---|---|---|---|
| 0 | 0 | 0 | 0 |
| 0 | 1 | 1 | 0 |
| 1 | 0 | 1 | 1 |
| 1 | 1 | 0 | -1 |

$$a(n) = c(n) \oplus a(n-2)$$
$$c'(n) = a(n) - a(n-2)$$
$$c(n) = |c'(n)|$$

FIG._4A

EPR4 CODING

| c(n) | a(n-3) | a(n-2) | a(n-1) | a(n) | c'(n) | \|x(n)\|modulo2 |
|---|---|---|---|---|---|---|
| 0 | 0 | 0 | 0 | 0 | 0 | 0 |
| 0 | 0 | 0 | 1 | 1 | 2 | 0 |
| 0 | 0 | 1 | 0 | 1 | 0 | 0 |
| 0 | 0 | 1 | 1 | 0 | 0 | 0 |
| 0 | 1 | 0 | 0 | 1 | 0 | 0 |
| 0 | 1 | 0 | 1 | 0 | 0 | 0 |
| 0 | 1 | 1 | 0 | 0 | -2 | 0 |
| 0 | 1 | 1 | 1 | 1 | 0 | 0 |
| 1 | 0 | 0 | 0 | 1 | 1 | 1 |
| 1 | 0 | 0 | 1 | 0 | 1 | 1 |
| 1 | 0 | 1 | 0 | 0 | -1 | 1 |
| 1 | 0 | 1 | 1 | 1 | 1 | 1 |
| 1 | 1 | 0 | 0 | 0 | -1 | 1 |
| 1 | 1 | 0 | 1 | 1 | 1 | 1 |
| 1 | 1 | 1 | 0 | 1 | -1 | 1 |
| 1 | 1 | 1 | 1 | 0 | -1 | 1 |

$$a(n) = c \oplus a(n-1) \oplus a(n-2) \oplus a(n-3)$$
$$c'(n) = a(n) + a(n-1) - a(n-2) - a(n-3)$$
$$c(n) = |c'(n)| \text{ modulo } 2$$

METHOD AND APPARATUS FOR ENCODING A BINARY SIGNAL

CROSS REFERENCE TO RELATED APPLICATIONS

This is a continuation of U.S. patent application Ser. No. 08/940,869, filed Sep. 30, 1997, entitled "Method and Apparatus for Encoding a Binary Signal" which is herein incorporated by reference now U.S. Pat. No. 6,035,435.

BACKGROUND OF THE INVENTION

1. Field of the Invention

The present invention relates generally to methods and apparatuses for storing and retrieving binary information from a magnetic storage medium. More specifically, the invention relates to methods and apparatuses for encoding information according to a scheme which avoids storing catastrophic sequences of data which are difficult to recover on the magnetic disc.

2. Description of the Related Art

Digital magnetic and optical storage systems record digital sequences onto media. The sequences are retrieved from an analog signal, sensed by a readback head. Generally, the analog signal is corrupted by noise, interference, and distortion. The fundamental design goal of such systems is to achieve the highest recording density per unit area while maintaining an acceptable probability of error between the recorded and the retrieved sequences. In order to achieve this design goal, read/write channels use a combination of coding and equalization approaches as are described below.

Magnetic Storage Media

Figure 1A:
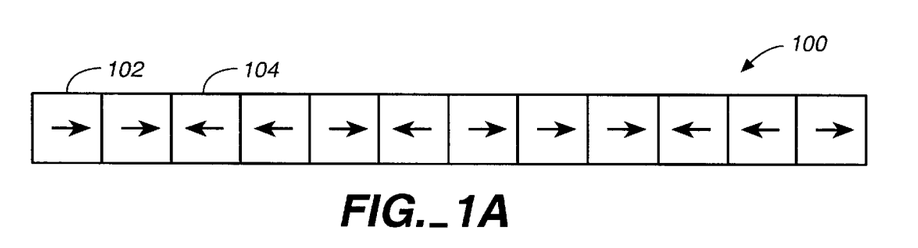
FIG. 1A is a schematic diagram which illustrates the alignment of magnetic domains on a typical data track of a magnetic storage disc.

Data is commonly stored on magnetic storage media by altering the alignment of magnetic domains in the media. One example of a magnetic storage media is a magnetic storage disc. FIG. 1A is a schematic diagram which illustrates the alignment of magnetic domains on a typical data track 100 of a magnetic storage disc. As a readback head scans these domains, a signal is produced from which the state of the domains may be determined and the data stored in the domains may be derived.

Saturation recording is a commonly used technique in magnetic recording systems. Saturation recording means that the domains on the media are fully magnetized in one direction or an opposite direction. This is shown in FIG. 1A by the arrows which indicate the alignment of the magnetic domains at each storage location. The domains at a storage location 102, for example, are oriented in one direction and the domains at a storage location 104 are oriented in the opposite direction. The input signal which programs the storage locations is therefore binary. The sequence of input symbols are denoted $a(n)$ and each $a(n)$ is taken from the binary set $\{0,1\}$. The sequence of input symbols, $a(n)$ is referred to as the media code sequence of symbols because it represents the symbols as they are written to the storage media. Because of the physical response of the reader head to the domains, the ideal, noise-free output $z(n)$ of a readback head scanning such a magnetically recorded disc is complex.

Figure 1B:
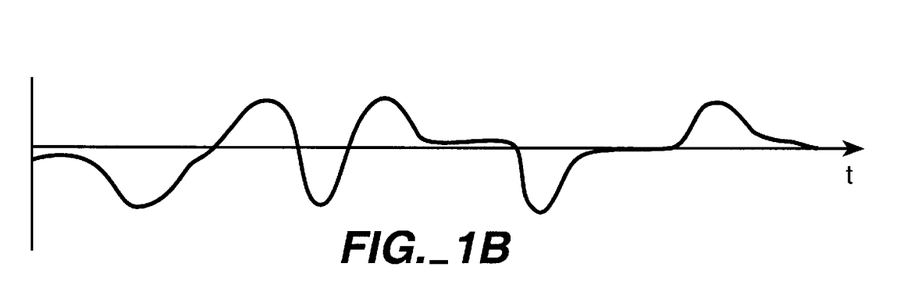
FIG. 1B is a plot over time of an idealized read signal that would be produced by a readback head scanning the storage locations shown in FIG. 1A.

FIG. 1B is a plot over time of an idealized read signal that would be produced by a readback head scanning the storage locations shown in FIG. 1A. When two successive storage locations have the same polarity, no output signal is produced. When the magnetic domains of two successive storage locations have opposite polarity, then a pulse is created and the difference in polarity of the change determined whether or not the pulse is positive or negative.

Recovery of the media code signal $a(n)$ is possible by analyzing the media output signal $z(n)$. As discussed below, $z(n)$ is usually equalized to a signal $x(n)$. As described below, in a maximum likelihood detection system, a Viterbi detector is used to determine the input sequence $a(n)$ which is most likely to result in the $x(n)$ which is input to the Viterbi detector.

Intersymbol Interference

One of the fundamental effects that limits the recording density in both magnetic and optical recording systems is intersymbol interference (ISI). ISI is the tendency of neighboring symbols as well as the symbol which is intended to be read at a given time to influence the output signal of the readback head. This effect is due to the bandlimited nature of the head/media combination and results in the overlap of responses due to sequentially recorded transitions on the media. That is, at a given instant in time, the output signal from the medium is composed of not only the response due to the input symbol at that instant, but also the responses from some previously recorded symbols. The amount and the span of this overlap increases as the linear recording density is increased, giving rise to overlap patterns among symbols that are generally very complex and hard to unravel with a simple device.

As symbols are stored more closely together, intersymbol interference makes it more and more difficult for individual symbols to be detected. Intersymbol interference is the tendency of the output of the readback head to be a function of both the readback head response to the symbol being read and also the response of the readback head to neighboring symbols. As symbols are stored closer and closer together, the response of the readback head may become an increasingly complex function of a number of sequentially recorded symbols. As the influence of neighboring symbols increases on the readback signal, it is increasingly likely that an error may be caused by intersymbol interference when reading a symbol.

Partial Response Signaling

In order to reduce the complexity required to unravel the ISI effect, a special signaling method, partial response (PR) been developed. PR signaling is described in H. K. Thapar and A. M. Patel, "A Class of Partial Response Systems for Increasing Storage Density in Magnetic Recording," IEEE Trans. on Magnetics, vol. 23, no. 5, pp. 3666–3668, September 1987, which is herein incorporated by reference for all purposes and will hereinafter be referred to as Reference 1. The readback signal is first equalized to a prescribed PR signal $x(n)$. The equalization filter is designed so that the combination of the media channel and equalization transforms the data signal into the PR signal, $x(n)$. PR signals allow for controlled overlap (or interference) of responses in the output signal due to successive input symbols. The a priori knowledge of the controlled ISI after the equalizer results in a significant reduction in the complexity of the required detector relative to that for the unequalized signal. The detector used is called a Viterbi detector. Sampled signal levels from the readback head are input to the Viterbi detector which determines the most probable input data, thus the Viterbi detector is referred to as a "maximum likelihood" detector and the method is called "partial response, maximum likelihood" (PRML).

The choice of the PR target signal is not unique, but dictated by the operating linear density. Indeed, many PR targets exist for the magnetic recording application as discussed in Reference 1. The first generation of Read Channel devices employing PR targets was based on the use of Class IV Partial Response signaling, referred to commonly as PRML (Partial Response Maximum Likelihood). As described in Reference 1, the focus of new generation devices is on Extended Partial Response Maximum Likelihood or EPRML. In an EPRML system, as in a PRML system, the input is binary, but five output levels instead of three are sensed so that the output is contained in the set $\{-2,-1,0,+1,+2\}$. The five sensed output levels provide information about the output which enables the Viterbi detector to determine the most likely sequence of stored inputs from the output. An advantage of EPRML is that it implements an equalization filter with a lower response at high frequencies and therefore avoids amplifying certain high frequency noise.

Figure 2:
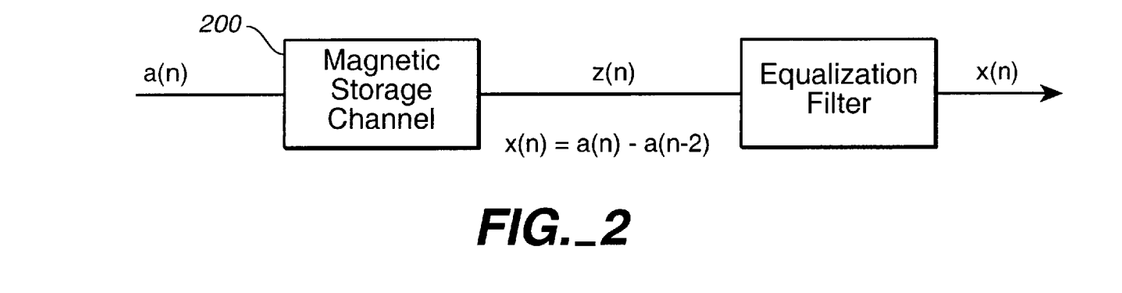
FIG. 2 is a block diagram illustrating a PRML system.

FIG. 2 is a block diagram illustrating a PRML system. A signal a(n) is the media code signal at time nT, where T is the channel symbol duration. The signal a(n) over time represents the sequence of binary symbols which are to be stored on and recovered from a magnetic storage channel 200. Magnetic storage channel 200 is also referred to as the media channel. After passing through magnetic storage channel 200 and an equalization filter 202, a(n) is transformed into x(n). For a PRML system where the signal is equalized to the Class IV Partial Response and the maximum-likelihood (ML) detection is performed with the Viterbi detector as described in Lee and Messerschmitt, Digital Communication, Kluwer Academic Press 1994. which is herein incorporated by reference for all purposes and will hereinafter be referred to as Reference 2, the equalized noise-free sampled output is given by the difference equation:

$$x(n)=a(n)-a(n-2) \qquad \text{Equ. 1}$$

where x(n) is the output sample value at time nT, a(n) is the media code at time nT, and T is the channel symbol duration. The input symbols a(n) are picked from the binary set $\{0,1\}$. The noise-free output sample values are ternary, namely, 0, +1, or −1. Equ. 1 is referred to as the partial response polynomial and may also be represented as the transfer function $1-D^2$ where D represents 1 unit time delay. $1-D^2$ is the standard PRML transfer function that describes the result of the prescribed intersymbol interference that characterizes PRML. The inverse of $1-D^2$ is represented as $1/(1-D^2)$.

Equ. 1 thus is represented by a standard PRML transfer function which describes the output of the equalization filter when the signal is equalized to the Class IV Partial Response. Other transfer functions exist for other systems which implement different partial response targets. For example, the transfer function for EPRML which describes the output of the Viterbi detector when the signal is equalized to the Extended Class IV Partial Response is $1+D^1-D^2-D^3$ and is derived according to the extended partial response polynomial:

$$x(n)=a(n)+a(n-1)-a(n-2)-a(n-3) \qquad \text{Equ. 2}$$

This equation will be discussed in detail later. In PRML systems where the equalized noise-free sampled output is given by Equ. 1, it is necessary to undo the transformation that is described by Equ. 1 in order to recover the data sequence a(n) which was stored on the magnetic medium. In Class IV Partial Response PRML systems, this is accomplished using a preceding step.

Figure 3:
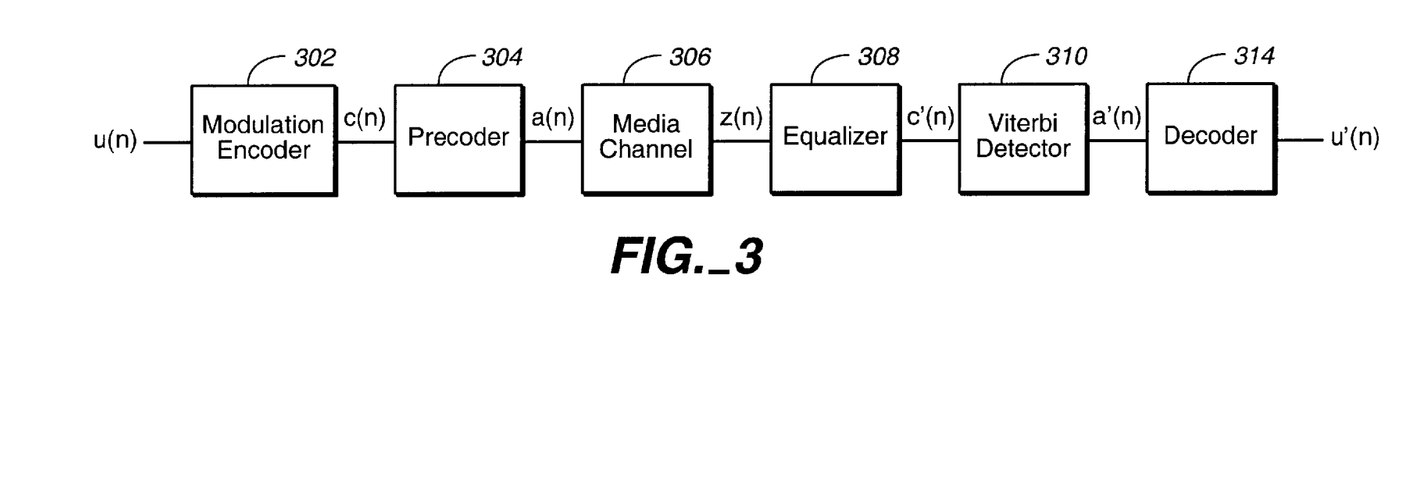
FIG. 3 is a block diagram illustrating a Class IV Partial Response PRML system which stores and recovers data from a user.

FIG. 3 is a block diagram illustrating a Class IV Partial Response PRML system which stores and recovers data from a user. A user signal u(n) represents actual data which is written to and recovered from the magnetic recording system. User signal u(n) is input to a modulation encoder 302 which encodes the signal as a binary signal c(n). The output of modulation encoder 302, c(n), is referred to as the channel code because it represents the actual code or signal which is written to the storage system.

If the channel code c(n) were written directly to the media, then the output after equalization, x(n), would be determined by c(n) according to the PRML partial response polynomial. In PRML systems, a precoder is used that inverts the effect of the PRML media channel and equalization so that the output after equalization is c'(n). It should be noted that c'(n) is not exactly identical to c(n), because c'(n) is not a binary signal, and generally has more than two allowed states. However, as will be seen below, each allowed state of c'(n) converts directly to one of the allowed binary values of c(n). The output of modulation encoder 302 is sent to a precoder 304. Precoder 304 implements a channel inverting transfer function which is a transfer function which is the inverse of the standard EPRML transfer function. The output of precoder 304, a(n), is written to a media channel 306.

When the media is read, a signal z(n) is obtained which represents the channel code c(n) transformed by the precoding and the media write and read processes. The signal z(n) is input to an equalizer 308 which outputs a signal c'(n). The signal c'(n) is the result of the transformation of the signal by media channel 306 and equalizer 308 and the preceding of c(n) by precoder 304 according to the channel inverting transfer function. A Viterbi detector determines the sequence of channel code c(n) which was most likely to have been written to media channel 306 via precoder 304, given the c'(n) that was detected. A decoder 314 converts c(n) to u'(n), the recovered signal which, if the system is successful differs from signal u(n) stored by the user by less than some allowable error tolerance.

Precoder 304 functions to invert the effect of the media channel combined with the equalization. That is, for a PRML system, the transfer function of precoder 304 is $1/(1 \oplus D^2)$. When such a precoder implemented, then the effect of the Class IV Partial Response PRML system is essentially to undo the transformation implemented by the precoder and the output of the Class IV Partial Response PRML system, c'(n), maps directly to the channel code.

According to equation 1, the equalized output is $$x(n)=a(n)-a(n-2) \qquad \text{Equ. 1}$$

To invert the transfer function $1-D^2$, solve for a(n), obtaining:

$$a(n)=x(n)+a(n-2) \qquad \text{Equ. 3}$$

Substituting c(n) for x(n), the equation which governs the precoder is derived:

$$a(n)=c(n)+a(n-2) \qquad \text{Equ. 4}$$

It should be noted that in modulo 2, addition and subtraction are both expressed by the exclusive or operation denoted by $\oplus$. That is:

$$a+b=a-b=a \oplus b.$$

Figure 4A:
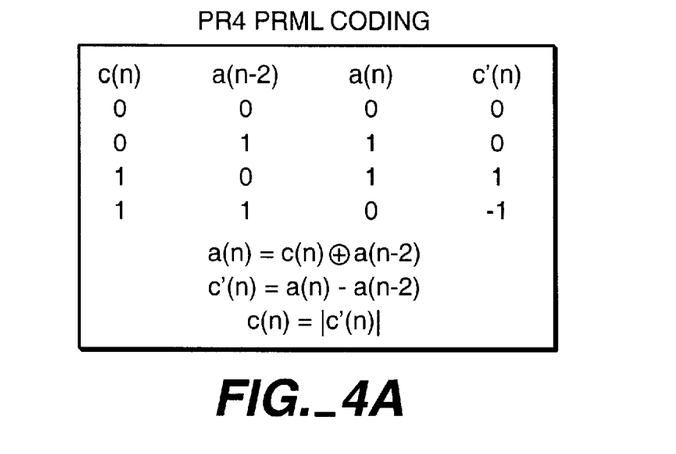
FIG. 4A is a chart which shows that when precoding is performed that inverts the media channel, then the absolute value of the output of the equalizer is equal to the channel code.

FIG. 4A is a chart which shows that when precoding is performed according to:

$$a(n)=c(n) \oplus a(n-2), \qquad \text{Equ. 5}$$

then the absolute value of the output of the equalizer, x(n), (which is denoted as c'(n)) is equal to the channel code c(n).

It is shown that this is true for all possible values of c(n), a(n), and a(n−2). The effect of the preceding step on a channel code signal c(n) is to cause c'(n) to be recovered after the known transformation caused by the media channel and equalization. Thus, when the precoder implements a transfer function which is the inverse of the standard PRML transfer function, the precoder inverts the channel and the absolute value of the output of the equalizer is the same as the channel code.

Similarly, a precoder could be designed for an EPRML system which inverts the channel.

According to equation 2, the equalized output of the equalizer for an EPRML system is:

$$x(n)=a(n)+a(n-1)-a(n-2)-a(n-3) \qquad \text{Equ. 2}$$

The transfer function of the system would therefore be:

$$1+D-D^2-D^3$$

To invert the transfer function $1+D-D^2-D^3$, solve for a(n), obtaining:

$$a(n)=x(n)-a(n-1)+a(n-2)+a(n-3) \qquad \text{Equ. 6}$$

Substituting c(n) for x(n), the equation which governs the precoder is derived:

$$a(n)=c(n)-a(n-1)+a(n-2)+a(n-3) \qquad \text{Equ. 7}$$

Again, it should be noted that in modulo 2, addition and subtraction are both expressed by the exclusive-or operation. Therefore, if a precoder is used which implements the equation:

$$a(n)=c(n)\oplus a(n-1)\oplus a(n-2)\oplus a(n-3) \qquad \text{Equ. 8}$$

then the channel will be inverted by the precoder and the channel bits can be recovered by taking the absolute value of x(n) modulo 2.

Figure 4B:
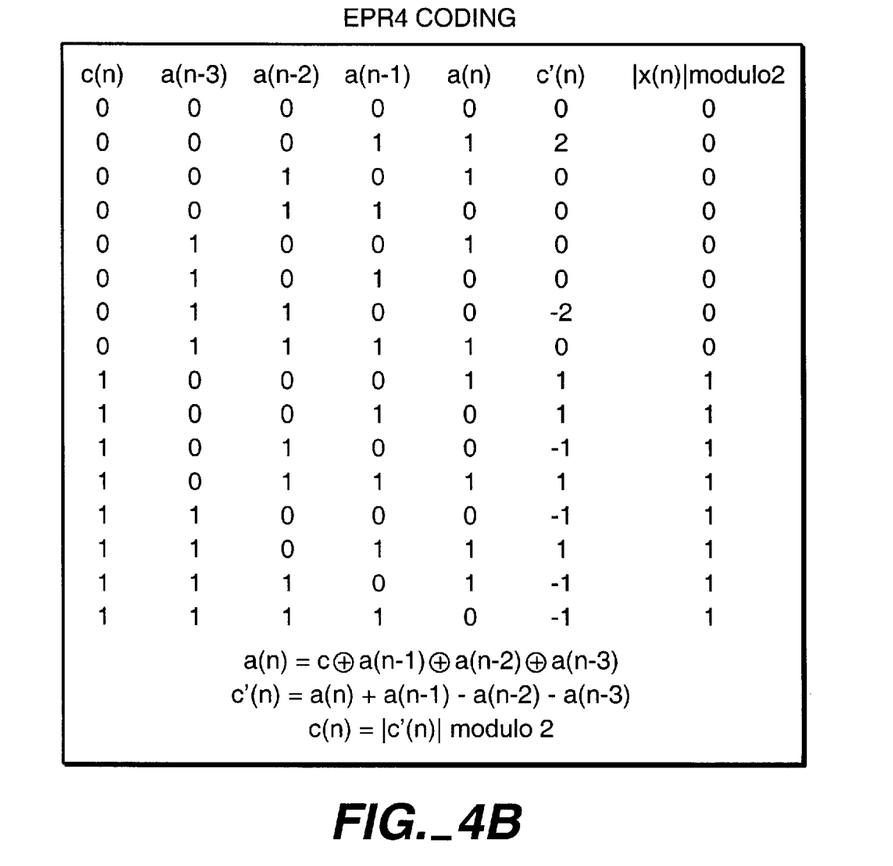
FIG. 4B is a chart which shows that when precoding is performed that inverts the media channel, then the absolute value of the output modulo 2 of the equalizer is equal to the channel code.

FIG. 4B is a chart which shows that when precoding is performed according to:

$$a(n)=x(n)\oplus a(n-1)\oplus a(n-2)\oplus a(n-3), \qquad \text{Equ. 8}$$

then the absolute value of the output modulo 2 of the equalizer x(n) ignoring noise (which is denoted as c'(n)) is equal to the channel code c(n). It is shown that this is true for all possible values of c(n), a(n), a(n−1), a(n−2), and a(n−3). Thus, when a(n), the binary output of the precoder is determined as a function of c(n), the binary channel bits, as well as the previous values of a(n) as described by Equ. 6, then the absolute value in modulus 2 of the output of the media channel and the equalizer, c'(n) is the same as the channel bits. Thus, as was shown above for the PRML precoder and the PRML channel, the EPRML precoder described above implements a transfer function which is the inverse of the standard EPRML transfer function and therefore inverts the EPRML channel.

RLL Codes—Avoiding Long Periods Between Signal Transitions

As described above, the output of modulation encoder 302 and precoder 304 is a media code sequence a(n). Certain sequences of media code are problematic for the system and must be avoided. For example, a long sequence of zeros can thwart the timing and gain update loops used to calibrate the reader.

As the readback head scans the recording medium, the timing of the sampling and the gain of the signal must constantly be updated to ensure that sampling occurs at the right point for each memory location and that the gain is adjusted to allow for changing media characteristics that affect the signal strength. If the channel code sequence repeatedly writes zero to the disk, then no signal is available to update the timing or gain loops and system degradation can result.

Currently, Digital magnetic and optical storage devices use run length limited (RLL) codes to improve signal detectability or insure frequent updates to the timing and gain loops, or both. The RLL codes are generally characterized by two parameters, d and k, which control, respectively, the minimum and the maximum number of symbol intervals between successive transitions in the binary input signal. For a given value of d, the RLL code insures that there are at least (d+1), and at most (k+1), symbol intervals between successive transitions. Commonly used codes in magnetic and optical storage products include codes with (d,k) constraints of (1,7) and (2,7). These codes are typically used with the Peak Detection method. The k constraint insures that a non-zero channel output is produced with some minimum frequency to maintain robust operation of timing and gain loops. The d constraint helps signal detectability with peak detection. With the growing interest in Partial Response Maximum Likelihood (PRML) techniques, d=0 codes are gaining in popularity because of their inherently higher code rates.

Catastrophic Sequences and Coding For PR Signaling

In addition to ensuring that timing and gain update information are provided, choosing a coding scheme which does not produce a response at the reader head caused by one sequence of media code which can easily be confused for a long number of samples with a response caused by a different sequence of media code is important with partial response signaling to achieve a prescribed performance within the constraints of a given hardware complexity. Catastrophic sequences of code which create a readback signal which varies by only a small amount must be avoided in PR systems to avoid creating long strings of readback signal which are not distinguishable by the Viterbi detector. When such long strings occur, the Viterbi detector must have a memory that is sufficiently large to store the strings until the most likely state of the stored data can be determined.

Consider the PRML system wherein the signal is equalized to the Class IV Partial Response (PR) and the maximum-likelihood (ML) detection is performed with the Viterbi detector as described in Reference 2. As noted above, The equalized noise-free sampled output is given by the difference equation:

$$y(n)=a(n)-a(n-2) \qquad \text{Equ. 1}$$

where y(n) is the sample value at time nT, a(n) is the input symbol at time nT, and T is the channel symbol duration.

Figure 5A:
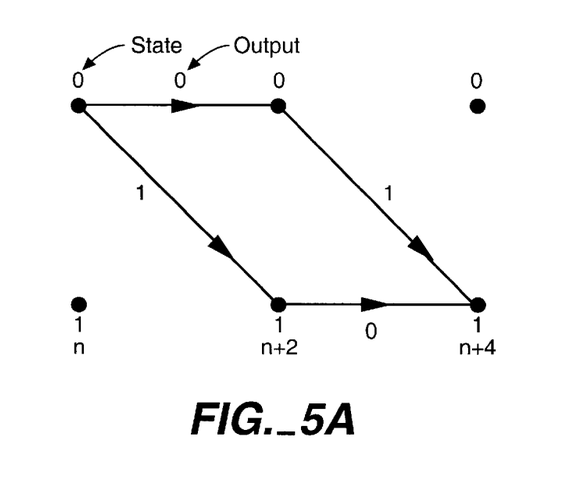
FIG. 5A is a trellis diagram illustrating an error event for PRML where the paths with labels 1 0 and 0 1 diverge from the common state 0 and remerge at state 1.

The Viterbi detector observes the noisy version of y(n) to produce estimates of the input sequence a(n). It performs the estimation recursively by comparing the received sample sequence against all allowed noise-free sample sequences, computing their differences in terms of the sum-of-squared-errors, and picking the noise-free sequence with the smallest difference. The performance of the Viterbi detector, computed in terms of the probability of error at moderate to high signal-to-noise ratio (SNR), is largely determined by the minimum Euclidean distance between sequences forming an error event, where an error event refers to a pair of noise-free sampled output sequences generated by paths that diverge from a common state and later remerge at a common state. FIG. 5A is a trellis diagram illustrating an error event for PRML where the paths with labels 1 0 and 0 1 diverge from the common state 0 and remerge at state 1. The associated squared-Euclidean distance is 2. It can be verified that the minimum squared-Euclidean distance for PRML is 2.

Figure 5B:
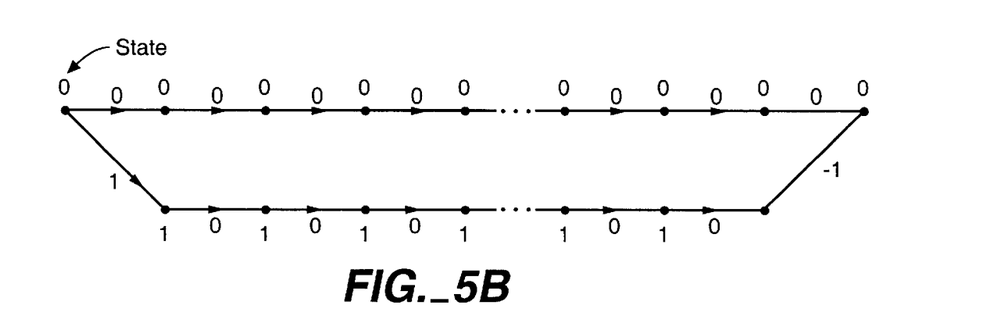
FIG. 5B is a trellis diagram illustrating an error event for PRML where the paths diverge from a common state 0 and do not remerge for some time.

In order to guarantee the minimum distance properties for PRML, coding of the input data to avoid certain sequences is necessary. FIG. 5B is a trellis diagram illustrating an error event for PRML where the paths diverge from a common state 0 and do not remerge for some time. The input data sequence is 00000 . . . 000. Such a sequence traces a path on the trellis comprising the output sampled sequence of all zero. The correct sequence can be confused with the input sequence 11111 . . . 110 to produce a minimum distance error event shown in FIG. 5B. If the path memory in the Viterbi detector is not long enough and prematurely truncated, the accumulated distance between the two allowed sequences would be 1, as shown in FIG. 1($b$), resulting in performance degradation. The two paths would therefore be confused by the Viterbi detector because the path memory of the Viterbi detector is not long enough.

Figure 5C:
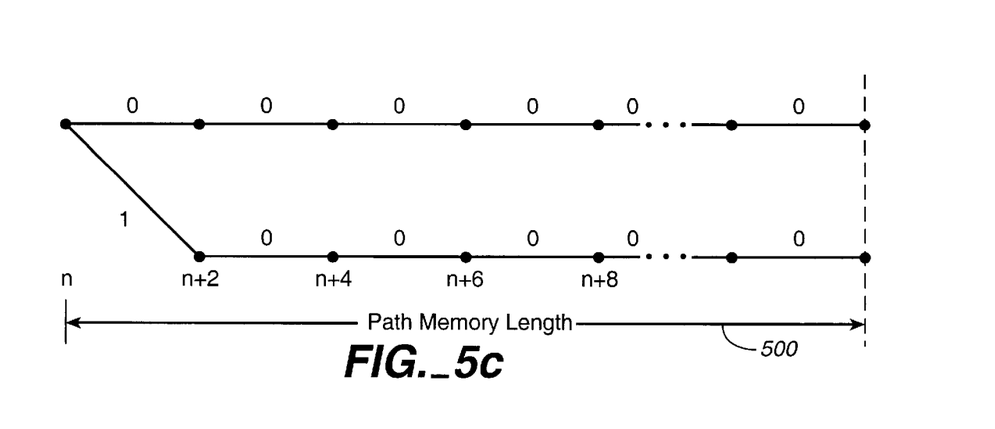
FIG. 5C is a trellis diagram illustrating an error event for PRML where the paths diverge from a common state 0 and do not remerge within a path memory length.

Pairwise sequences of unbounded length (and their associated paths) within the trellis that do not accumulate the full minimum distance are referred to as catastrophic sequences. FIG. 5C is a trellis diagram illustrating an error event for PRML where the paths diverge from a common state 0 and do not remerge within a path memory length 500. Such an error event is referred to as an open error event and would not be detected by a Viterbi detector with path memory length 500.

Coding can be used to eliminate such sequences, and thereby effect the realization of the full minimum distance over some prescribed memory path maximum length. That is, the coding of the signal being stored can be selected to prevent the storage of a catastrophic sequence. In the example shown in FIG. 5C, coding could be used to prevent the storage of a greater number of consecutive zeros than the length of the Path Memory. For a given a transfer function such as 1–$D^2$, what is needed is some form of coding that will prevent catastrophic sequences from occurring. When a precode is used which inverts the channel such as is described above, then constraining the modulation code to not include catastrophic sequences prevents a signal which represents a catastrophic sequence from being produced at the readback head. It is most desirable that any constraints incorporated into the modulation code be relatively simple so that a modulation code which obeys the constraints may be readily created.

Thus, the maximum length required for the realization of the full minimum distance may be defined by the proper choice of a modulation code together with a precode. This maximum length also determines the survivor memory requirements within the Viterbi detector. In general, the goal of the code design is to minimize the maximum length required. The design of modulation codes for PRML channels is described in Marcus, Siegel, and Wolf, "Finite State Modulation Codes for Data Storage," IEEE Journal of Selected Areas in Communications, vol. 10, no. 1, pp. 5–37, January 1992, which is herein incorporated by reference for all purposes and will hereinafter be referred to as Reference 3 and in Eggenberger and Patel, U.S. Pat. No. 1,707,681, issued November 1987, which is herein incorporated by reference for all purposes and will hereinafter be referred to as Reference 4.

Unlike RLL codes for peak detection which require only a minimum and a maximum run lengths as constraints, the PRML codes generally do not require a minimum run length (that is, d=0) but do require additional constraints on the recorded sequences to guarantee minimum distance error events of bounded length.

In view of the foregoing, what is needed is a modulation encoding scheme for EPRML that will prevent catastrophic sequences from occurring. When a precoder which uses the channel inverting transfer function as described above is used, it is difficult to design such a modulation encoding scheme that directly limits the maximum length required for the realization of the full minimum distance in EPRML. Another approach to designing a modulation encoding scheme is needed.

SUMMARY OF THE INVENTION

Accordingly, the present invention provides an apparatus and method for preceding and modulation encoding data for an EPRML channel that directly bounds the maximum length required for the realization of the full minimum distance in EPRML. The combined modulation encoding and preceding directly limits the maximum length required for the realization of the full minimum Euclidean distance between error events. This allows the path memory length in the Viterbi detector to be limited so that catastrophic errors are avoided.

It should be appreciated that the present invention can be implemented in numerous ways, including as a process, an apparatus, a system, a device, a method, or a computer readable medium. Several inventive embodiments of the present invention are described below.

In one embodiment, a method of avoiding catastrophic error sequences in a media code sequence of symbols for data storage on a storage medium according to EPRML includes modulation encoding user data which is to be stored on the storage medium using a modulation encoder. The modulation encoder outputs a channel code modulation output symbol sequence. The modulation code is defined according to a modulation criteria wherein the set of all possible modulation output symbol sequences is constrained in a manner which excludes certain excluded modulation output symbol sequences. A precoder precodes the channel code modulation output symbol sequence according to a preceding transfer function. The preceding transfer function transforms the channel code modulation output symbol sequence into a media code sequence of symbols and the preceding transfer function is defined so that when modulation encoding is performed according to the modulation criteria, the media code sequence of symbols is constrained to exclude EPRML catastrophic error sequences of greater than a determined length. The combination of the modulation encoding and the preceding prevents the media code sequence of symbols from including EPRML catastrophic error sequences greater than the determined length.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In one embodiment, an apparatus and method are provided for encoding d=0 run-length constrained media code sequences to the EPR4 partial response target. The constraints on the media code sequences are realized when modulation encoding is performed by a modulation encoder wherein the set of all possible modulation output symbol sequences is constrained in a manner that excludes certain modulation output symbol sequences. The maximum length required for the realization of the full minimum Euclidean error distance in EPRML is directly limited by the combined modulation encoding and precoding. This allows the path memory length in the Viterbi detector to be limited so that catastrophic errors are avoided.

The encoding of the data sequence in the EPRML transmission or storage channel to which is taught limits the path memory length requirement in the Viterbi detector to a finite size and constrains the minimum distance error event length. In one embodiment, the minimum distance error event length is constrained to at most two codewords, where a codeword is 17 bits.

Figures 6, 7:
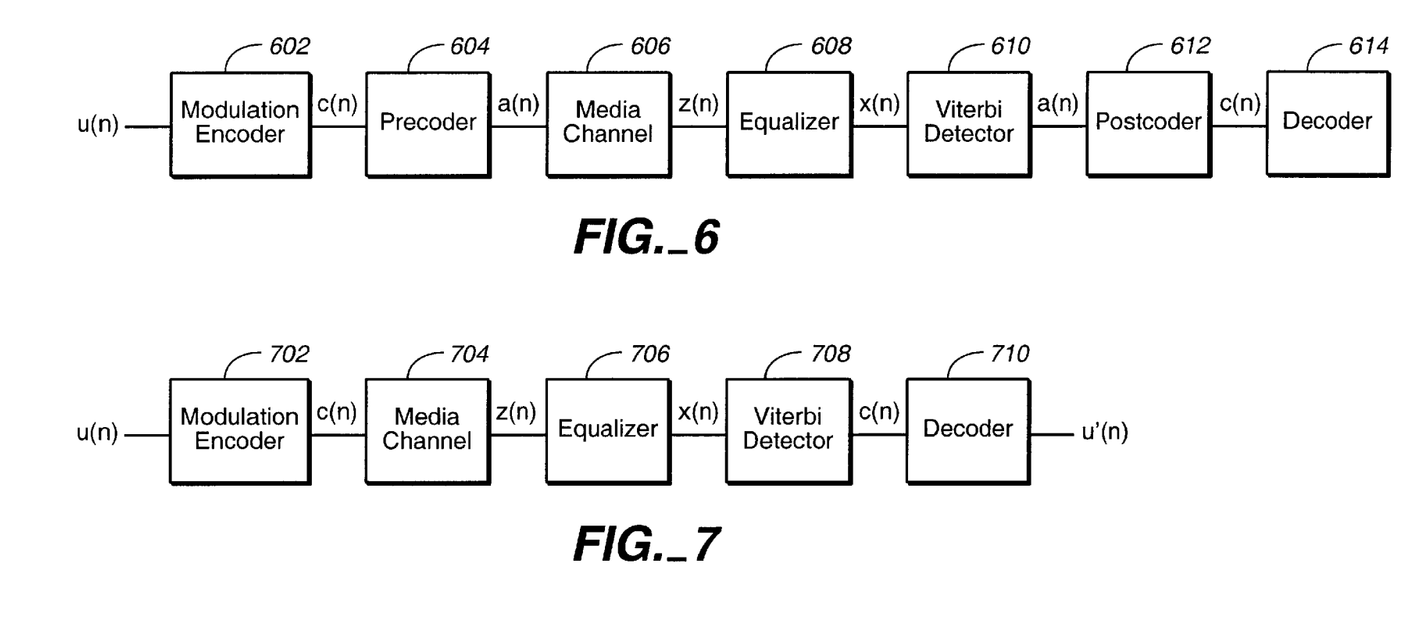
FIG. 6 is a block diagram illustrating an EPRML system that stores and recovers data from a user.
FIG. 7 is a block diagram illustrating a system that does not include a precoder.

FIG. 6 is a block diagram illustrating an EPRML system according to the present invention that stores and recovers data from a user. A user signal u(n) represents data which is written to and recovered from the recording system. User signal u(n) is input to a modulation encoder 602 which encodes the signal as a channel code signal c(n). Channel code signal c(n) is input to a precoder 604. Unlike precoder 304 shown in FIG. 3 that inverts the PRML channel, precoder 604 does not invert the EPRML channel. The purpose of precoder 604 is not to invert the EPRML channel so that the equalized EPRML output maps directly to the channel code. Instead, the purpose of precoder 604 is to enable a modulation encoding scheme, such as a (0,G/I) code as described below, to be used that avoids catastrophic error sequences such as are described below in the media code. Precoder 604 implements a precoding transfer function that is not a channel inverting transfer function.

The output of precoder 604 is a media code, a(n), that is written to a media channel 606. When the media is read, a signal z(n) is obtained which represents the channel code c(n) transformed by the media write and read processes. The signal z(n) is input to an equalizer 608 which outputs a signal x(n). The signal x(n) is the result of the transformation of the signal by media channel 606 and equalizer 608 and the precoding of c(n) by precoder 604 according to the preceding transfer function. A Viterbi detector determines the sequence of media code a(n) which was most likely to have been written to media channel 606 via precoder 604, given the x(n) that was detected. A postcoder 612 converts a(n) to c(n). Postcoder 612 thus inverts the transformation of c(n) to a(n) performed by precoder 604. A decoder 614 converts a(n) to u'(n), the recovered signal which differs from signal u(n) stored by the user by less than some allowable error tolerance.

Determining the Error Events for EPRML

Since the goal of the design is to limit the minimum distance error event length, the first step in designing the code is to identify the catastrophic sequences which will cause the output of the reader head to create open error events such as the one shown in FIG. 4C. Exhaustive simulations analyzing every possible input and state combination for an EPRML system have shown that, for a d=0 constraint, there are two types of minimum distance error events for EPRML. Let a(n) denote the correct Non-Return-to-Zero (NRZ) media code sequence and a'(n) denote the incorrectly detected NRZ sequence. Let e(n) denote the error between the correct and the incorrect sequences; that is e(n)=a(n)-a'(n). The catastrophic error sequences {e(n)} fall into one of the following two categories:

(1) e(n)=±1 followed by (0, ±1) repeated n times, where n is a nonnegative integer, possibly unbounded.

(2) e(n)=±1 followed by ±(-1, 1) repeated n times, where n is a nonnegative integer, possibly unbounded.

Catastrophic error sequence type 1 is also a catastrophic error sequence for PRML. It can be shown that catastrophic error sequence 1 results from interleaved sequences of media code that produce the same equalizer output. Catastrophic error sequence type 2 is a catastrophic error sequence that exists for EPRML but does not exist for PRML. For the first type of error events, only every other written symbol controls whether or not an error occurs. Thus errors in the even and odd interleaves are independent of each other. For the second type of error events, the error events have contributions from both the odd and even interleaves. Catastrophic error sequence 2 results from media code sequences which are not interleaved.

Thus, if there exists for a given media code sequence of symbols {a(n)} an alternative allowed media code sequence of symbols {a'(n)} such that the difference between the two sequences {a(n)} and {a'(n)}, denoted {e(n)}, is a catastrophic error sequence, then the media code sequence of symbols is said to include the catastrophic error sequence. This presents a problem for maximum likelihood detection, as is shown below.

The significance of error sequence 1 and error sequence 2 in EPRML is that the output of the EPRML equalizer is the same for either of the two sequences a(n) and a(n) so that the two sequences may be confused for a long period of time. This can be seen by looking at the EPRML polynomial, given in equation 6:

$$x(n)=a(n)+a(n-1)-a(n-2)-a(n-3) \qquad \text{Equ. 2}$$

For example, consider for a type 2 catastrophic error sequence, where each successive number in two sequences a(n) and a'(n) differs by −1 and +1 in an alternating pattern as described for error sequence type 2 above. The difference in the output, x(n) as a result of two such sequences would be 0 for as long as the type 2 error sequence persists because each a(n) term would cancel out each a(n−1) term and each a(n−2) term would cancel out each a(n−3) term. As a result, no information is provided to the maximum likelihood Viterbi detector which allows the Viterbi detector to tell the sequences apart. The Viterbi must contain a path memory that is longer than the maximum length of the catastrophic error sequence in order to tell the two sequences a(n) and a'(n) apart.

The first category of error occurs with PRML systems; and the second category is unique to EPR4. Note that for the first type of error events, only every other written symbol controls whether or not an error occurs. Thus errors in the even and odd interleaves are independent of each other. For the second category of error events, the error events have contributions from both the odd and even interleaves.

In order to avoid catastrophic errors, the length of any error sequence must be limited to less than the memory length of the Viterbi detector. A modulation code could be designed to directly produce a media code with constraints to exclude the error sequences described above. To do so, it would be necessary to exclude all pairs of sequences a(n) and a'(n) that have an error sequence e(n) that is a catastrophic error sequence. Designing a modulator that accomplishes this for EPRML systems is difficult if a standard preceding transfer function that inverts the media channel is used. This is not the case for a PRML system.

Precoding is used to simplify the modulation code construction. As noted above, the common choice for the precoder is the inverse of the polynomial for the partial response system. Thus, the precoder for PRML is given by $1/(1 \oplus D^2)$ since the PR4 polynomial is given by $(1-D^2)$, where D is the delay operator and $\oplus$ denotes a modulo-2 sum operation which is the same as an exclusive or. Since only type 1 errors occur for a partial response system, those errors can be avoided by simply limiting the number of consecutive zeros contained in each interleave.

If the same idea of inverting the polynomial for the partial response system is applied to the modulation code design for EPR4, the choice of the precoder is $(1/(1 \oplus D \oplus D^2 \oplus D^3))$ since the EPR4 polynomial is given by $1+D-D^2-D^3$. While such a precoder can be used for EPRML, it does not simplify the problem of constructing the modulation code for EPR4.

In one preferred embodiment, a noninverting precoder for EPR4 is provided that simplifies the constraints placed on the modulation code construction. The precoder used is $1/(1 \oplus D^2)$, the same as the precoder that inverts the channel for PR4. Such a precoder allows one to use manageable code constraints to design the modulation code for EPRML. The code constraints with the precoder described above are designated (0,G/I), where 0 represents the d constraint, G is the maximum number of consecutive 0's in the encoded data stream, and I is the maximum number of consecutive 0's in each interleave. The G constraint limits the Viterbi survivor length and error propagation length for the second category of error events mentioned above and the I constraint limits the Viterbi survivor length and error propagation length for the first category of error events.

Given these code constraints, modulation codes have been developed which conform to (0,G/I) codes that correspond to a (0,6/8) code and a (0,6/6) code.

With the precoder $1/(1 \oplus D^2)$, the following 16/17(0,6/6) and 16/17(0,6/8) codes can be used to limit the Viterbi survivor length and error propagation length.

16/17(0,6/6) Code

The 16 user symbols:

A7 A6 A5 A4 A3 A2 A1 A0 B0 B1 B2 B3 B4 B5 B6 B7 are mapped to the seventeen channel symbols:

P7 P6 P5 P4 P3 P2 P1 P0 C Q0 Q1 Q2 Q3 Q4 Q5 Q6 Q7

According to the following relationships defined in the modulation Encoder, where & indicates the AND logical operation, | indicates the OR logical operation and ~ indicates the inverse. First, the following intermediate values are computed:

M0=A7|A6|A5|A4  N0=B7|B6|B5|B4

M1=A7|A5|A3|A1  N1=B7|B5|B3|B1

M2=A6|A4|A2|A0  N2=B6|B4|B2|B0

S=M0&N0&M1&N1&M2&N2

S01=M0&~N0

S02=M0&N0

S03=M0&~N0

S11=M0&N0&~M1

S12=M0&N0&M1&~N1

S21=M0&N0&M1&N1&~M2

S22=M0&N0&M1&N1&M2&~N2

Next, the seventeen channel symbol values are computed using the user symbols and the intermediate variables:

P7=S&A7|S01&A2|S02|S03|S11&B61|S12&A7|S21&A7|S22&B3

P6=S&A6|S01&A7|S02&B0|S03&A0|S11&B5|S12&B6|S21&A5|S22&B7

P5=S&A5|S01|S11|S12|S21|S22|B1

P4=S&A4|S01&A6|S02&A0|S03&A1|S11&B4|S12&B4|S21&B5|S22&B5

P3=S&A3|S01&A3|S02&A3|S03&A3|S11&B3|S12&B2|S21&A3|S22

P2=S&A2|S01&A5|S02&A2|S03&A2|S11&B2|S12&A2|S21&B0|S22&A2

P1=S&A1|S01&A1|S02&A1|S03|S11&B0|S12&B0|S21&A1|S22&A0

P0=S&A0|S01&A4|S02|S03|S11|S21

C=S

Q0=S&B0|S01|S02&B4|S03|S12|S21

Q1=S&B1|S01&B1|S02&B1|S03|S11&B1|S12&A1|S21&B1|S22&A1

Q2=S&B2|S01&B2|S02&B5|S03&B2|S11&A0|S12&A0|S21&B2|S22

Q3=S&B3|S01&B3|S02&B3|S03&B3|S11&A2|S12&A3|S21&B3|S22&A3

Q4=S&B4|S01&B0|S02&B6|S03&B1|S11&A4|S12&A4|S21&B4|S22&A4

Q5=S&B5|S02|S11|S12|S21|S22&A5
Q6=S&B6|S01&A0|S02&B7|S03&B0|S11&A6|S12&A6
    |S21&B6|S22&A6
Q7=S&B7|S01|S02&B2|S03|S11&B7|S12&A5|S21&B7
    |S22&A7

The decoder converts the recovered channel bits back to the user bits according to the following relation ships. First, the following intermediate values are computed:

S=C
S01=~C& P5& Q0&~Q5& Q7
S02=~C& P7&~P5& P0& Q5
S03=C&~P5& P1& P0& Q0& Q1&~Q5& Q7
S11=~C& P5& P0&~Q0& Q5
S12=~C& P5&~P0& Q0& Q5
S21=~C& P5& P0& Q0& Q5
S22=~C& P3&~P0&~Q0& Q2

Then, the input symbols are derived:
A7=S&P7|S01&P6|S12&P7|S21&P7|S22&Q7
A6=S&P6|S01&P4|S11&Q6|S12&Q6|S22&Q6
A5=S&P5|S01&P2|S12&Q7|S21&P6|S22&Q5
A4=S&P4|S01&P0|S11&Q4|S12&Q4|S22&Q4
A3=S&P3|S01&P3|S02&P3|S03&P3|S12&Q3|S21&P3
    |S22&Q3
A2=S&P2|S01&P7|S02&P2|S03&P2|S11&Q3|S12&P2
    |S22&P2
A1=S&P1|S01&P1|S02&P1|S03&P4|S12&Q1|S21&P1
    |S22&Q1
A0=S&P0|S01&Q6|S02&P4|S03&P6|S11&Q2|S12&Q2
    |S22&P1
B0=S&Q0|S01&Q4|S02&P6|S03&Q6|S11&P1|S12&P1
    |S21&P2
B1=S&Q1|S01&Q1|S02&Q1|S03&Q4|S11&Q1|S21&Q1
    |S22&P5
B2=S&Q2|S01&Q2|S02&Q7|S03&Q2|S11&P2|S12&P3
    |S21&Q2
B3=S&Q3|S01&Q3|S02&Q3|S03&Q3|S11&P3|S21&Q3
    |S22&P7
B4=S&Q4|S02&Q0|S11&P4|S12&P4|S21&Q4
B5=S&Q5|S02&Q2|S11&P6|S21&P4|S22&P4
B6=S&Q6|S02&Q4|S11&P7|S12&P6|S21&Q6
B7=S&Q7|S02&Q6|S11&Q7|S21&Q7|S22&P6

Similarly, the following definitions are used for a 16/17 (0,6/8) Code:

16/17 (0,6/8) Code
The 16 user symbols:
A7 A6 A5 A4 A3 A2 A1 A0 B0 B1 B2 B3 B4 B5 B6 B7
are mapped to the seventeen symbols channel symbols:
P7 P6 P5 P4 P3 P2 P1 P0 C0 Q0 Q1 Q2 Q3 Q4 Q5 Q6 Q7
according to the following relationships defined in the modulation Encoder, where & indicates the AND logical operation, | indicates the OR logical operation and ~indicates the inverse. First, the following intermediate values are computed:

M0=A7|A6|A5|A4|N0=B7|B6|B5|B4
M1=A6|A4|A2|A0|N1=B6|B4|B2|B0
S=M0& N0&M1&N1
S01=~M0
S02=~M0& N0
S11=M0&N0&~M1
S12=M0& N0& M1&~N1

Next, the seventeen channel symbol values are computed using the user symbols and the intermediate variables:
P7=S&A7|S01|S02&A6|S11&B3|S12&A6
P6=S&A6|S02|S11&B2|S12&A7
P5=S&A5|S01&B5|S02&A5|S11&B1|S12&A4
P4=S&A4|S01&A0|S02&A4|S11|S12&A5
P3=S&A3|S01&A3|S02&A3|S11&A3 S12&A2
P2=S&A2|S01&A2|S02&A2|S11&A1|S12&A1
P1=S&A1|S01&A1|S02|S11|S12&A0
P0=S&A0|S01|S02|S12
C=S
Q0=S&B0|S01&B0|S02&B0|S11&B4|S12
Q1=S&B1|S01&B1|S02&B1|S11&B5|S12
Q2=S&B2|S01&B2|S02&B2|S11&B6|S12&B1
Q3=S&B3|S01&B3|S02&B3|S11&B7|S12&B3
Q4=S&B4|S01&B4|S02&A0|S11&A5|S12&A3
Q5=S&B5|S01|S02|S11
Q6=S&B6|S01&B6|S02&A1|S11&A7|S12&B5
Q7=S&B7|S01&B7|S02&A7|S11&B0|S12&B7

The decoder converts the recovered channel bits back to the user bits according to the following relation ships. First, the following intermediate values are computed:

S=c
S01=~C&~P6& P0& Q5
S02=~C& P6& P0& Q5
S11=~C& ~P0& Q5
S12=~C& ~Q5

Then the user bits are derived:
A7=S&P7|S02&Q7|S11&Q6|S12&P6
A6=S&P6|S02&P7|S12&P7
A5=S&P5|S02&P5|S11&Q4|S12&P4
A4=S&P4|S02&P4|S12&P5
A3=S&P3|S01&P3|S02&P3|S11&P3|S12&Q4
A2=S&P2|S01&P2|S02&P2|S12&P3
A1=S&P1|S01&P1|S02&Q6|S11&P2|S12&P2
A0=S&P0|S01&P4|S02&Q4|S12&P1
B0=S&Q0|S01&Q0|S02&Q0|S11&Q7
B1=S&Q1|S01&Q1|S02&Q1|S11&P5|S12&Q2
B2=S&Q2|S01&Q2|S02&Q2|S11&P6
B3=S&Q3|S01&Q3|S02&Q3|S11&P7|S12&Q3
B4=S&Q4|S01&Q4|S11&Q0
B5=S&Q5|S01&P5|S11&Q1|S12&Q6
B6=S&Q6|S01&Q6|S12&Q2
B7=S&Q7|S01&Q7|S11&Q3|S12&Q7

Methods for designing (0, G/I) codes are described in B. Marcus et. al., "Finite-state modulation codes for data storage," *IEEE Communications Magazine,* vol. 29, no. 12, pp. 68–86, December 1991. which is herein incorporated by reference for all purposes and will hereinafter be referred to as reference 5.

The preceding (0,G/I) error codes, combined with a precoder that implements the transfer function $1/(1 \oplus D^2)$, directly ensure that the length of any catastrophic error sequence is bounded. The length of the G constraint directly bounds the catastrophic error sequences of type 1 and the length of the I constraint directly bounds the catastrophic error sequences of type 2. In one embodiment, if the length of the G constraint is 6 and the length of the I constraint is 6, the length of any catastrophic error sequence after precoding is bounded to 13. (The G constraint directly limits the length to 6, the I constraint directly limits the length to 11 because of interleaving, and the overall length is limited to 13 when precoding is included.) Consequently, if a Viterbi detector with a path memory length greater than 13 is provided, then the media code will not include a catastrophic sequence that is greater than the memory path length of the Viterbi detector and that therefore creates an ambiguity. In certain embodiments, a longer Viterbi detector memory path length is used to allow for non-minimum distance errors.

Thus, by providing a precoder which implements a transfer function that does not invert the media channel, one embodiment of the present invention provides an (0,G/I) modulation code that directly limits the length of any catastrophic error sequence included in the media code sequence. It is particularly important that in this aspect, the present invention provides a precoder that enables an (0,G/I) modulation code to be used that directly limits the length of catastrophic sequences that cause minimum distance error events in an EPRML system. As will be described below, in other embodiments, modulation codes are used that limit the length of catastrophic error sequences without any precoding.

The advantage of the precoder taught in the above embodiment for EPRML is that an (0,G/I) modulation code can be used in combination with the precoder to limit the length of catastrophic error sequences. (0,G/I) codes may be generated by standard techniques available in the art of encoding. Other modulation codes, such as the one described in the embodiment below that uses no precoding, may be more difficult to generate. In addition to the 16/17 (0,G/I) codes shown above, other (0,G/I) codes are used as required in combination with the precoder described above to limit the length of catastrophic error sequences. For example, an 8/9 (0,6/3) code is used in another embodiment.

In other alternative embodiments, different noninverting precoding transfer functions and modulation codes that limit catastrophic error sequences are used. For example, in one alternative embodiment, an 8/9 code is used without preceding to avoid Type I and Type II errors. FIG. 7 is a block diagram illustrating a system that does not include a precoder. A user signal u(n) represents actual data which is written to and recovered from the magnetic recording system. User signal u(n) is input to a modulation encoder 702 which encodes the signal as a binary signal c(n). The output of modulation encoder 302, c(n), is referred to as the channel code. In this embodiment, the channel code is also the media code because no precoder is used that inverts the effect of the PRML media channel and equalization. The output of modulation encoder 302, c(n), is written to a media channel 704.

When the media is read, a signal z(n) is obtained which represents the channel code c(n) transformed by the media write and read processes. The signal z(n) is input to an equalizer 706 which outputs a signal x(n). The signal x(n) is the result of the transformation of the signal by media channel 704 and equalizer 706. A Viterbi detector determines the sequence of channel code c(n) that was most likely to have been written to media channel 704, given the x(n) that was detected. A decoder 710 converts a(n) to u'(n), the recovered signal which differs from signal u(n) stored by the user by less than some allowable error tolerance.

In order to limit the length of catastrophic error sequences in the above described system, the modulation code that is used in modulation encoder 302 must not output channel code that contains catastrophic error sequences of greater than a specified length. In one embodiment, the 8/9 modulation code shown below was developed that successfully avoided catastrophic error sequences of greater length than 8. This was done by exhaustively analyzing all possible output channel code sequences that could create catastrophic error sequences exceeding the given length and designing a modulation code that does not include such sequences as part of its output. It should be noted that the design of such a code is in many cases more difficult than designing a standard (0,G/I) code. As noted above, it is generally preferred that a preceding scheme that allows a (0, G/I) code to be used for a modulation code. However, in some cases the elimination of any preceding may be desirable and may outweigh the difficulty of designing an appropriate modulation code.

One 8/9 modulation code that does not require any preceding as described above is derived as follows:

The eight user symbols:

X7 X6 X5 X4 X3 X2 X1 X0 are mapped to the nine channel symbols:

Y8 Y7 Y6 Y5 Y4 Y3 Y2 Y1 Y0.

according to the following relationships defined in the modulation Encoder where & indicates the AND logical operation, I indicates the OR logical operation and ~ indicates the inverse. First, the following intermediate values are computed:

M1=X1X3|X5;

M2=X1&X3&X5;

N1=X0|X2|X4;

N2=X0&X2&X4;

P=M1&~M2;

Q=N1&~N2;

R1=~P&Q;

R2=~P&~Q.

Next, the nine channel symbol values are computed using the user symbols and the intermediate variables:

Y7=X7;

Y5=P&X5|~P&~N1|R1&X4;

Y3=P&X3|R1&X2|R2&X6;

Y1=P&X1|~P&N2|R1&X0;

Y8=~M1&~Q|P&X6|R1&~X6;

Y6=~M1&~Q|P&X4|R1&X6;

Y4=M2|P&~X2;

Y2=M2|P&X2;

Y0=M1|P&X0;

The decoder converts the recovered channel bits back to the user bits. First, the following intermediate values are computed:

A1=Y2|Y4;

A2=Y2&Y4;

B1=Y6|Y8;

B2=Y6&Y8;

F=A1&~A2;

G=B1&~B2;

H1=~F&G;

H2=~F&~G;

X7=Y7.

Then, the eight user symbols are derived according to the following equations:

X5=A2|F&Y5;

X3=A2|F&Y3;

X1=A2|F&Y1;

X6=F&Y8|H2&Y3|H1&Y6;

X4=F&Y6|H2&Y1|H1&Y5;
X2=F&Y2|H2&Y1|H1&Y3;
X0=F&Y0|~F&Y1.

The system described above limits the length of catastrophic errors without precoding. It, together with the system that uses precoding to enable an (0,G/I) modulation code to limit catastrophic error length, represent preceding or non-precoding schemes that do not invert the effect of the EPRML communication channel with equalization. Thus, it has been shown that precoding can either be eliminated or a precoder can be selected that simplifies the derivation of a modulation code but does not invert the channel.

Although the foregoing invention has been described in some detail for purposes of clarity of understanding, it will be apparent that certain changes and modifications may be practiced within the scope of the appended claims. It should be noted that there are may alternative ways of implementing both the process and apparatus of the present invention. . Accordingly, the present embodiments are to be considered as illustrative and not restrictive, and the invention is not to be limited to the details given herein, but may be modified within the scope and equivalents of the appended claims.

What is claimed is:

1. An EPRML data storage system for storing data on a storage medium in a manner that avoids catastrophic error sequences in a media code sequence of symbols, comprising:

a modulation encoder configured to encode user data that is to be stored on the storage medium, wherein the modulation encoder outputs a channel code modulation output symbol sequence, and the modulation encoder uses a modulation code that is defined according to a modulation criteria wherein the set of all possible modulation output symbol sequences is constrained in a manner which excludes certain excluded modulation output symbol sequences; and a precoder configured to precode the channel code modulation output symbol sequence according to a precoding transfer function, wherein the precoding transfer function transforms the channel code modulation output symbol sequence into a media code sequence of symbols and the precoding transfer function is defined so that when modulation encoding is performed according to the modulation criteria, the media code sequence of symbols is constrained to exclude EPRML catastrophic error sequences of greater than a determined length;

whereby the combination of the modulation encoding and the preceding prevents the media code sequence of symbols from including EPRML catastrophic error sequences greater than the determined length.

2. An EPRML data storage system as recited in claim 1 wherein the precoding transfer function is substantially different from a channel inverting transfer function, the channel inverting transfer function being defined as a transfer function which is the inverse of the standard EPRML transfer function.

3. An EPRML data storage system as recited in claim 1 further including a Viterbi detector configured to determine the most likely media code sequence of symbols written to the storage medium by processing an equalized output signal from a readback head.

4. An EPRML data storage system as recited in claim 3 wherein the catastrophic error sequence is a bounded catastrophic error sequence having a length and wherein the precoding transfer function is defined so that when modulation encoding is performed according to the modulation criteria, the media code sequence of symbols is constrained to exclude EPRML catastrophic error sequences which are longer than the length of the bounded catastrophic error sequence.

5. An EPRML data storage system as recited in claim 4 wherein the length of the memory of the Viterbi detector is greater than the length of the bounded catastrophic error sequence.

6. An EPRML data storage system as recited in claim 3 wherein the length of the bounded catastrophic error sequence is constrained directly by limiting the number of consecutive zeros in the channel code modulation output symbol sequence.

7. An EPRML data storage system as recited in claim 6 wherein the length of the bounded catastrophic error sequence is constrained to be equal to the number of consecutive zeros in the channel code modulation output symbol sequence.

8. An EPRML data storage system as recited in claim 3 wherein the length of the bounded catastrophic error sequence is constrained directly by limiting the number of consecutive interleaved zeros in the channel code modulation output symbol sequence.

9. An EPRML data storage system as recited in claim 8 wherein the length of the bounded catastrophic error sequence is constrained to be equal to twice the number of consecutive interleaved zeros in the channel code modulation output symbol sequence.

10. An EPRML data storage system as recited in claim 1 wherein the length of the bounded catastrophic error sequence is constrained directly by limiting the number of consecutive interleaved zeros in the channel code modulation output symbol sequence.

11. An EPRML data storage system as recited in claim 1 wherein the length of the bounded catastrophic error sequence is constrained to be equal to twice the number of consecutive interleaved zeros in the channel code modulation output symbol sequence.

12. An EPRML data storage system as recited in claim 1 wherein the media code sequence of symbols is derived from the user data using a (0,G/I) code.

13. An EPRML data storage system as recited in claim 12 wherein the precoder implements a transfer function $1/(1 \oplus D^2)$.

14. An EPRML data storage system for storing data on a storage medium in a manner that avoids catastrophic error sequences in a media code sequence of symbols, comprising:

a modulation encoder configured to encode user data that is to be stored on the storage medium, wherein the modulation encoder outputs a channel code modulation output symbol sequence, and the modulation encoder uses a modulation code that is defined according to a modulation criteria wherein the set of all possible modulation output symbol sequences is constrained in a manner which excludes EPRML catastrophic error sequences of greater than a determined length; and a media channel write output configured to store the output of the modulation encoder on a digital media, without precoding the output of the modulation encoder according to a precoding transfer function;

whereby the modulation encoding prevents the media code sequence of symbols from including EPRML catastrophic error sequences greater than the determined length.

15. An EPRML data storage system as recited in claim 14 further including a Viterbi detector configured to determine the most likely media code sequence of symbols written to the storage medium by processing an equalized output signal from a readback head.

16. An EPRML data storage system as recited in claim 15 wherein the catastrophic error sequence is a bounded catastrophic error sequence having a length and wherein the precoding transfer function is defined so that when modulation encoding is performed according to the modulation criteria, the media code sequence of symbols is constrained to exclude EPRML catastrophic error sequences which are longer than the length of the bounded catastrophic error sequence.

17. An EPRML data storage system as recited in claim 16 wherein the length of the memory of the Viterbi detector is greater than the length of the bounded catastrophic error sequence.

18. An EPRML data storage system as recited in claim 15 wherein the length of the bounded catastrophic error sequence is constrained directly by limiting the number of consecutive zeros in the channel code modulation output symbol sequence.

19. An EPRML data storage system as recited in claim 18 wherein the length of the bounded catastrophic error sequence is constrained directly by limiting the number of consecutive zeros in the channel code modulation output symbol sequence.

20. An EPRML data storage system as recited in claim 18 wherein the length of the bounded catastrophic error sequence is constrained directly by limiting the number of consecutive interleaved zeros in the channel code modulation output symbol sequence.

21. An EPRML data storage system as recited in claim 20 wherein the length of the bounded catastrophic error sequence is constrained to be equal to twice the number of consecutive interleaved zeros in the channel code modulation output symbol sequence.

22. An EPRML data storage system as recited in claim 14 wherein the length of the bounded catastrophic error sequence is constrained directly by limiting the number of consecutive interleaved zeros in the channel code modulation output symbol sequence.

23. An EPRML data storage system as recited in claim 14 wherein the length of the bounded catastrophic error sequence is constrained to be equal to twice the number of consecutive interleaved zeros in the channel code modulation output symbol sequence.

\* \* \* \* \*